United States Patent
Ueki et al.

(10) Patent No.: US 12,362,123 B2
(45) Date of Patent: Jul. 15, 2025

(54) FUSE ELEMENT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Misato Ueki, Mie (JP); Yutaka Takata, Mie (JP); Kotaro Takada, Osaka (JP); Shinichiro Yoshida, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 16 days.

(21) Appl. No.: 18/283,767

(22) PCT Filed: Mar. 10, 2022

(86) PCT No.: PCT/JP2022/010503
§ 371 (c)(1),
(2) Date: Sep. 22, 2023

(87) PCT Pub. No.: WO2022/209695
PCT Pub. Date: Oct. 6, 2022

(65) Prior Publication Data
US 2024/0194434 A1    Jun. 13, 2024

(30) Foreign Application Priority Data
Mar. 30, 2021 (JP) .................. 2021-057150

(51) Int. Cl.
*H01H 85/46* (2006.01)
*H05K 1/16* (2006.01)

(52) U.S. Cl.
CPC ............. *H01H 85/463* (2013.01); *H05K 1/16* (2013.01); *H05K 2201/0162* (2013.01); *H05K 2201/10181* (2013.01)

(58) Field of Classification Search
CPC .... H01H 85/463; H01H 85/165; H01H 85/17; H05K 1/16; H05K 2201/0162; H05K 2201/10181; H05K 1/0393; H05K 1/0293
See application file for complete search history.

(56) References Cited

U.S. PATENT DOCUMENTS 5,040,717 A * 8/1991 McGaffigan ....... B23K 35/0222
228/56.3
5,712,610 A     1/1998 Takeishi et al.
(Continued)

FOREIGN PATENT DOCUMENTS

JP    H05-166454 A    7/1993
JP    H10-050184 A    2/1998
(Continued)

OTHER PUBLICATIONS

Reginald Davey, "Properties of Polyethylene Terephthalate Polyester (PET, PETP)", Jun. 25, 2003, AZO Materials, Entire Document (https://www.azom.com/article.aspx?ArticleID=2047). (Year: 2003).*
(Continued)

*Primary Examiner* — Stephen S Sul
(74) *Attorney, Agent, or Firm* — Venjuris, P.C.

(57) ABSTRACT

It is aimed to provide a fuse element capable of interrupting an electrical circuit while suppressing the formation of carbide when an abnormal current is generated. A fuse element 10 is provided with an insulating base material 3, a conductor layer 1 provided on a surface of the base material
(Continued)

3 and an insulating protection layer 4 provided on a surface of the conductor layer 1. The protection layer 4 has a specific heat of 1.1 J·g$^{-1}$·K$^{-1}$ or more and a specific gravity of 1.0 g·cm$^{-3}$ or more.

9 Claims, 1 Drawing Sheet

(56) References Cited

U.S. PATENT DOCUMENTS

| | | | | |
|---|---|---|---|---|
| 5,932,345 | A * | 8/1999 | Furutani | H01L 23/293 |
| | | | | 428/209 |
| 2005/0140491 | A1* | 6/2005 | Uehara | H01H 37/761 |
| | | | | 337/401 |
| 2005/0141164 | A1* | 6/2005 | Bender | H01H 85/046 |
| | | | | 361/104 |
| 2018/0192511 | A1 | 7/2018 | Tsumagari et al. | |
| 2020/0234905 | A1* | 7/2020 | Shirakata | H01L 23/3135 |
| 2021/0057180 | A1* | 2/2021 | Wang | H01H 85/046 |
| 2023/0260675 | A1* | 8/2023 | Jung | H01H 85/0241 |
| | | | | 174/113 R |
| 2023/0274903 | A1* | 8/2023 | Milliere | H01H 69/02 |
| | | | | 337/273 |

FOREIGN PATENT DOCUMENTS

| | | | | |
|---|---|---|---|---|
| JP | 2001-052593 | A | 2/2001 | |
| JP | 2001-339126 | A | 12/2001 | |
| JP | 3638889 | B2 * | 4/2005 | ............ C08J 9/0066 |
| JP | 2017-011191 | A | 1/2017 | |

OTHER PUBLICATIONS

Yasuki Minoru; Kadode Hiroyuki; Tabuchi Akira; Tate Yoshifumi; Kawakami Shogo; Kuroda Masatoshi; Kishimoto Tetsuo; Kimura Koichi, "Dielectric Resin Foam and Electric Wave Lens Using the Same", Apr. 13, 2005, Otsuka Chemical Co Ltd; Sumitomo Electric Industries (Translation of JP 3638889). (Year: 2005).*

"Polyimide Properties", Sep. 14, 2011, TopLine.tv, Entire Document. (Year: 2011).*

International Search Report issued on May 24, 2022 for WO 2022/209695 A1 (4 pages).

* cited by examiner

FUSE ELEMENT

CROSS REFERENCE TO RELATED APPLICATIONS

This application is a national phase of PCT application No. PCT/JP2022/010503, filed on 10 Mar. 2022, which claims priority from Japanese patent application No. 2021-057150, filed on 30 Mar. 2021, all of which are incorporated herein by reference.

TECHNICAL FIELD

The present disclosure relates to a fuse element.

BACKGROUND

In an electrical circuit, a small-size fuse is used for the purpose of protection from an abnormal current. A chip fuse is cited as an example of the small-size fuse. In the chip fuse, a pair of terminal electrodes are provided on an insulating board and those terminal electrodes are connected by a fusible conductor. When an abnormal current is generated, the fusible conductor is fused and cut by the heat generation of the fusible conductor itself or by the heat generation of a heating conductor film provided between the terminal electrodes together with the fusible conductor as disclosed in Patent Document 1.

Further, a flexible printed circuit board (FPC) may be used as a small-size fuse. The structure of the FPC is, for example, disclosed in Patent Document 2. A conductor layer for constituting a circuit pattern is provided on a surface of a base material. If the FPC is arranged between a pair of electrodes and the electrodes are connected by the conductor layer of the FPC, the conductor layer generates heat and is fused and cut when an abnormal current is generated between the electrodes.

PRIOR ART DOCUMENT

Patent Document

Patent Document 1: JP H10-050184 A
Patent Document 2: JP 2001-339126 A

SUMMARY OF THE INVENTION

Problems to be Solved

In a fuse element formed such that a conductor provided on an insulating base material is fused and cut like a chip fuse and a fuse configured using an FPC (FPC fuse), a member present near the conductor and containing an organic polymer may form carbide due to heat when the conductor is fused and cut. A protection layer for protecting a conductor layer is cited as a member arranged near the conductor and possibly forming carbide when the conductor is fused and cut in the FPC. In a layer containing an organic compound like the protection layer, carbide formed as the conductor is fused and cut also includes an electrically conductive carbide. The electrically conductive carbide possibly forms an electrical conduction path between electrodes. Then, even if the conductor is fused and cut when an abnormal current flows between the electrodes, a new electrical conduction path is formed by the carbide and an electrical circuit cannot be interrupted. That is, a function as the fuse cannot be sufficiently exhibited.

In view of the above, it is aimed to provide a fuse element capable of interrupting an electrical circuit while suppressing the formation of carbide when an abnormal current is generated.

Means to Solve the Problem

The present disclosure is directed to a fuse element with an insulating base material, a conductor layer provided on a surface of the base material and an insulating protection layer provided on a surface of the conductor layer, the protection layer having a specific heat of $1.1\ J \cdot g^{-1} \cdot K^{-1}$ or more and a specific gravity of $1.0\ g \cdot cm^{-3}$ or more.

Effect of the Invention

The fuse element according to the present disclosure can interrupt an electrical circuit while suppressing the formation of carbide when an abnormal current is generated.

DESCRIPTION OF EMBODIMENTS OF PRESENT DISCLOSURE

Figure 1:
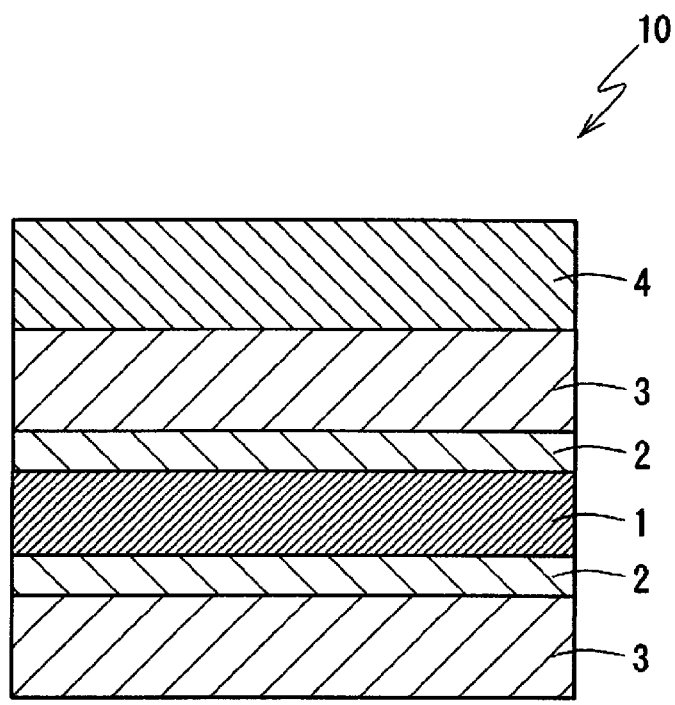
FIG. 1 is a section showing a layer configuration of the above fuse element.

First, embodiments of the present disclosure are listed and described.

The fuse element of the present disclosure is provided with an insulating base material, a conductor layer provided on a surface of the base material and an insulating protection layer provided on a surface of the conductor layer, the protection layer having a specific heat of $1.1\ J \cdot g^{-1} \cdot K^{-1}$ or more and a specific gravity of $1.0\ g \cdot cm^{-3}$ or more.

If the fuse element is provided in the middle of an electrical circuit to be interrupted when an abnormal current is generated and a circuit current flows via the conductor layer of the fuse element, the conductor layer is fused and cut, thereby interrupting the electrical circuit, when the abnormal current is generated and heat is generated in the conductor layer. Here, the protection layer provided on the surface of the conductor layer has a large heat capacity by having a specific heat of $1.1\ J \cdot g^{-1} \cdot K^{-1}$ or more and a specific gravity of $1.0\ g \cdot cm^{-3}$ or more. Thus, even if the conductor layer generates heat when being fused and cut, a temperature of the protection layer hardly rises. By suppressing a temperature rise of the protection layer, carbide is hardly formed in the protection layer and a situation where the circuit is interrupted by the formation of an electrical conduction path via electrically conductive carbide is hardly occurs.

The fuse element may be configured using a flexible printed circuit board, and the base material and the conductor layer of the fuse element are respectively constituted by a base layer and a metal foil of the flexible printed circuit board. By using the flexible printed circuit board, a small-size fuse element can be easily and inexpensively formed. At this time, by configuring the protection layer using a material having predetermined specific heat and specific gravity, the formation of carbide in the protection layer and a failure in the interruption of the electrical circuit associated therewith can be suppressed when the metal foil is fused and cut.

The protection layer may contain at least one of a silicone resin and a modified silicone resin. Among various resin materials, silicone resins and modified silicone resins have relatively large specific gravity and specific heat and are excellent in effect of suppressing a temperature rise of the protection layer and the formation of carbide associated therewith when the conductor layer is fused and cut. Further, if the protection layer contains the silicone resin or modified silicone resin, silicon oxides ($SiO_x$) are formed in an interface between the protection layer and the conductor layer as the conductor layer generates heat, whereby the formation of carbide in the protection layer is further suppressed.

The protection layer may contain an insulating filler. The insulating filler improves the specific heat of the protection layer and exhibits a high effect in suppressing a temperature rise of the protection layer and the formation of carbide associated therewith when the conductor layer is fused and cut.

The protection layer may contain foam cells. The foam cells improve the specific heat of the protection layer and exhibit a high effect in suppressing a temperature rise of the protection layer and the formation of carbide associated therewith when the conductor layer is fused and cut. The foam cells can be easily formed by mixing a foaming agent in the protection layer and heating the protection layer.

DETAILS OF EMBODIMENT OF PRESENT DISCLOSURE

Hereinafter, a fuse element according to an embodiment of the present disclosure is described in detail using the drawings. In this specification, various physical values are values measured in the atmosphere at a room temperature (roughly 20° C. to 25° C.). Further, that a certain component is a main contact of a certain material means that that component accounts for 50% by mass or more of the entire material.

<Structure of FPC Fuse>

First, an FPC fuse configured using a flexible printed circuit board (FPC) is described as an example of a fuse element according to the present disclosure. FIG. 1 shows a layer configuration of a cross-section of the FPC fuse 10 according to one embodiment of the present disclosure. The FPC fuse 10 is used to connect a pair of electrodes in the middle of an electrical circuit provided on a circuit board.

As shown in FIG. 1, the FPC fuse 10 has a laminated structure of a plurality of layers. Specifically, the FPC fuse 10 includes a base layer (base material) 3 and a metal foil (conductor layer) 1 for covering at least one surface of the base layer 3. The base layer 3 and the metal foil 1 are bonded by an adhesive layer 2. An insulating protection layer 4 is provided on a surface of the metal foil 1. The protection layer 4 may be fixed to the surface of the metal foil 1 via a layer (not shown) of an adhesive. Such a laminated structure is adopted in a conventional general and versatile FPC.

The base layer 3 is configured as an insulating base material. A material for constituting the base layer 3 is not particularly limited, but a flexible polymer material used as a base layer of a general FPC such as polyethylene terephthalate (PET) or polyimide (PI) can be suitably used. A copper foil, which is a material used in a general FPC, is preferably used as the metal foil 1. A thickness of the metal foil 1 is preferably 10 μm or more in terms of ensuring sufficient electrical conductivity. On the other hand, the thickness of the metal foil 1 is preferably 50 μm or less in terms of making the metal foil 1 easily ruptured even with a small amount of heat generation when an abnormal current flows. Constituent materials of the adhesive layer 2 and an adhesive arbitrarily arranged between the metal foil 1 and the protection layer 4 are also not particularly limited, and an acrylic-based, epoxy-based, urethane-based or silicone-based adhesive or the like may be used.

The protection layer 4 covers the surface of the metal foil 1 and is provided as an outermost layer of the FPC fuse 10. A protection layer is also called as a coverlay and functions to protect a surface of a metal foil while insulating in an FPC. As described in detail later, the protection layer 4 has predetermined physical properties in the FPC fuse 10 according to this embodiment. As described later, the fuse element of the present disclosure can also be configured other than as the FPC fuse 10, but the fuse element can be made flexible by being the FPC fuse 10 and easily formed using the inexpensively mass-producible FPC.

<Configuration of Protection Layer>

In the FPC fuse 10 according to this embodiment, the protection layer 4 has the predetermined physical properties. That is, the protection layer 4 has at least one of a specific heat of 1.0 $J \cdot g^{-1} \cdot K^{-1}$ or more and a specific gravity of 1.0 $g \cdot cm^{-3}$ or more. Preferably, the protection layer 4 has both of those specific heat and specific gravity.

A heat capacity of a substance increases as a specific heat increases and a specific gravity increases. Thus, in the FPC fuse 10, as the protection layer 4 has a larger specific heat and a larger specific gravity, a heat capacity increases even if the protection layer 4 is formed to have the same thickness and a temperature of the protection layer 4 hardly rises when the protection layer 4 is heated.

Here, a case is considered where an abnormal current (abnormally large current) is generated in a configuration in which the FPC fuse 10 is arranged between a pair of electrodes and the electrodes are electrically connected by the metal foil 1 covered by the protection layer 4 in an intermediate part of an electrical circuit. If the abnormal current of the electrical circuit flows in the metal foil 1, the metal foil 1 generates heat due to electrical resistance. If a temperature of the metal foil 1 reaches a temperature equal to or higher than a melting point or sublimation point due to self heat generation, the metal foil 1 is fused and cut. If the metal foil 1 is fused and cut, conduction via the metal foil 1 is blocked in the electrical circuit and a current no longer flows in the electrical circuit. In this way, the electrical circuit is protected from the abnormal current.

By the generation of the abnormal current, the metal foil 1 generates heat as described above. The heat generated in the metal foil 1 is also transferred to the adjacent protection layer 4. Then, the protection layer 4 is heated. At this time, if the protection layer 4 is heated up to a high temperature, carbide may be formed from an organic substance constituting the protection layer 4. The formed carbide also includes electrically conductive one. If the electrically conductive carbide is formed in the protection layer 4, an electrical conduction path via the electrically conductive carbide is possibly formed at a position where the conduction of the metal foil 1 is blocked by fusing and cutting the metal foil 1. Then, the conduction of the metal foil 1 is not blocked or the conduction once blocked by fusing and cutting the metal foil 1 is formed again. As a result, despite that the metal foil was fused and cut, conduction in the electrical circuit cannot be actually interrupted or the conduction once blocked is formed again. Therefore, the electrical circuit cannot be protected from an abnormal current.

However, the protection layer 4 of the FPC fuse 10 according to this embodiment has a large heat capacity by having a specific heat of 1.0 $J \cdot g^{-1} \cdot K^{-1}$ or more and/or a specific gravity of 1.0 g·cm$^{-3}$ or more and the temperature thereof hardly rises. Thus, even if the adjacent metal foil 1 generates heat as an abnormal current is generated, a temperature rise and the formation of carbide associated therewith hardly occur in the protection layer 4. Therefore, a situation where a conduction path is formed at the position where the metal foil 1 was fused and cut by the abnormal current by the contribution of the electrically conductive carbide formed in the protection layer 4 hardly occurs and the electrical circuit can be properly protected from the abnormal current.

The specific heat of the protection layer 4 is 1.1 J·g$^{-1}$·K$^{-1}$ or more, more preferably 1.3 J·g$^{-1}$·K$^{-1}$ or more. Further, the specific gravity of the protection layer 4 is 1.1 g·cm$^{-3}$ or more, more preferably 1.2 g·cm$^{-3}$ or more. Particularly preferably, the protection layer 4 has both a specific heat of 1.1 J·g$^{-1}$·K$^{-1}$ or more and a specific gravity of 1.0 g·cm$^{-3}$ or more. No particular upper limits are provided for the specific heat and specific gravity of the protection layer 4, but generally the specific heat is 3.0 J·g$^{-1}$·K$^{-1}$ or less and the specific gravity is 2.0 g·cm$^{-3}$ or less in a material practically usable as the protection layer 4 for protecting the metal foil 1.

A thickness of the protection layer 4 is also not particularly limited, but is preferably 30 μm or more in terms of sufficiently exhibiting an effect of protecting the metal foil 1 and enhancing the heat capacity of the protection layer 4 by a volume effect. On the other hand, the thickness of the protection layer 4 is preferably 1 mm or less, such as in terms of enhancing the flexibility of the FPC fuse.

A specific constituent material of the protection layer 4 is not particularly limited as long as having the predetermined physical properties, but preferably mainly contains an organic polymer. Silicone resins, modified silicone resins, urethane resins, fluororesins including polytetrafluoroethylene and the like can be cited as organic polymers suitably usable as the constituent material of the protection layer 4. One type of the organic polymer may be used or two or more types of the organic polymers may be used in combination.

Out of the various organic polymers listed above, at least one of a silicone resin and a modified silicone resin is particularly preferably used as the organic polymer for constituting the protection layer 4. Preferably, a main component of the organic polymer for constituting the protection layer 4 or the entire organic polymer may be a silicone resin and/or modified silicone resin. Amino groups, carboxyl groups and the like can be illustrated as modified groups contained in the modified silicone resin.

Since the silicone resins and modified silicone resins (hereinafter, collectively called silicone resins unless otherwise specified) have relatively high specific heat and specific gravity, out of the various organic polymers, these provide a large heat capacity and the carbonization of the protection layer 4 is easily suppressed. Further, in the FPC fuse 10 provided with the protection layer 4 containing the silicon resin, if the metal foil 1 generates heat, silicon oxides (SiO$_x$) are formed in a region of an interface facing the metal foil 1, out of the protection layer 4. By this formation of the silicon oxides, the formation of carbide in the protection layer 4 associated with the heat generation of the protection layer 4 is effectively suppressed. This is thought to be because the formed silicon oxides have high thermal insulation and melting point. As just described, the formation of carbide in the protection layer 4 associated with the heat generation of the metal foil 1 is effectively suppressed by both an effect of providing a large heat capacity by the protection layer 4 containing the silicone resin and an effect of forming the silicon oxides in the interface on the side of the metal foil 1. Note that the silicon oxides formed in the interface of the protection layer 4 include not only pure oxides having a composition of SiO$_x$, but also compounds containing a smaller amount of other elements such as C less than O in addition to Si and O.

Further, the protection layer 4 preferably contains an insulating filler in addition to the organic polymer. This is because the specific heat of the protection layer 4 is easily increased by containing the insulating filler. An insulating filler generally having a thermal conductivity of 10 W/m·K or less may be used. The type of the specific insulating filler is not particularly limited, but inorganic particles of calcium carbonate, titanium oxide, silica and the like and hollow particles such as glass bubbles can be cited as such. A content of the insulating filler in the protection layer 4 is not particularly limited, but is preferably 5% by mass or more in ratio to the entire protection layer 4, such as in terms of enhancing an effect of improving the specific heat. On the other hand, the content of the insulating filler is preferably 30% by mass of less, such as in terms of preventing characteristics of the protection layer exhibited by the polymer material from being impaired.

In terms of enhancing the specific heat, the protection layer 4 may contain foam cells instead of containing the insulating filler or in addition to the insulating filler. The foam cells are bubbles formed inside the protection layer 4 by the foaming of a foaming agent and enhances the specific heat of the entire protection layer 4. To contain the foam cells in the protection layer 4, the foaming agent may be mixed in the material in forming the protection layer 4 and foamed by heating after the material is molded into a film shape.

The type of the foaming agent used in forming the foam cells is not particularly limited, but the use of a foaming agent made of an azo compound, a nitroso compound or a hydrazine derivative is preferable. This is because these compounds often produce a nitrogen gas without containing water at the time of foaming and a situation can be avoided where water adheres to a ruptured position of the metal foil 1 and the vicinity thereof to form a conduction path via water when an abnormal current is generated by water remaining inside the protection layer 4. Azodicarbonamide, barium azodicarboxylate and the like can be cited as examples of the azo compound. N,N'-nitrosopentamethylenetetramine and the like can be cited examples of the nitroso compound, and hydrazodicarbonamide, 4, 4'-oxybis (benzenesulfonyl hydrazide) and the like are cited as examples of the hydrazine derivative. One type of the foaming agent may be used or two or more types of the foaming agents may be used in combination. A content of the foaming agent in the protection layer is not particularly limited, but is, for example, preferably 5% by mass or more in ratio to the entire protection layer 4, such as in terms of enhancing an effect of improving the specific heat by the foam cells. On the other hand, the content of the foaming agent is preferably 20% by mass or less, such as in terms of maintaining high mechanical strength of the protection layer 4.

<Other Forms>

A form in which the protection layer 4 of the FPC fuse 10 has the predetermined physical properties was described above as an example of the embodiment of the present disclosure. However, the fuse element of the present disclosure is not limited to such a form.

The fuse element of the present disclosure is not limited to the FPC fuse and may be the one including an insulating base material, a conductor layer provided on a surface of the base material and an insulating protection layer provided on a surface of the conductor layer. The protection layer may have at least one of a specific heat of 1.0 J·g 1·K$^{-1}$ or more and a specific gravity of 1.0 g·cm$^{-3}$ or more. Preferably, the protection layer has a specific heat of 1.1 J·g$^{-1}$·K$^{-1}$ or more and a specific gravity of 1.0 g·cm$^{-3}$ or more. The base material, the conductor layer and the protection layer constituting the above laminated structure correspond to the base layer 3, the metal foil 1 and the protection layer 4 in the FPC fuse 10. Besides the form using the FPC, structures such as a pattern fuse provided as a circuit pattern on a printed board and a chip fuse mounted on a printed board can be cited as examples of the form of the fuse element having the laminated structure. A layer directly in contact with the conductor layer is preferably constituted by the protection layer having the above specific heat and specific gravity, but the protection layer may be provided on the surface of the conductor layer via another layer. For example, the protection layer may cover the conductor layer via a base material (base layer) and/or a layer of an adhesive as in samples used in Examples described later.

Further, in the fuse element, not only the protection layer, but also a layer adjacent to the conductor layer on a side opposite to the protection layer or a layer interposed between the protection layer and the conductor layer such as the adhesive layer and the base material may also have the above predetermined specific heat and/or specific gravity. Then, when the conductor layer generates heat, the formation of carbide can be suppressed not only in the protection layer, but also in the adhesive layer and the base material.

EXAMPLES

Examples are described below. Note that the present invention is not limited by these examples.
<Fabrication of Samples>

An FPC fuse was prepared by providing base layers on both surfaces of a copper foil via adhesive layers and providing a protection layer on a surface of one of those base layers. In this FPC fuse, the base layer was a polyimide resin layer having a thickness of 25 μm, the adhesive layer was an epoxy resin layer having a thickness of 10 μm and a conductor layer was the copper foil having a thickness of 35 μm. Using the following resins A to D, the protection layer was fabricated as a layer having a thickness of 50 μm. Further, tapes A, B are respectively adhered as protection layers of other forms.

The types of materials used in forming the protection layers are as follows.
  Resin A: Silicone resin ("1537E" produced by ThreeBond Holding Co., Ltd.)
  Resin B: Silicone resin ("CV9204-20" produced by Dow Toray Co., Ltd.) added with 10% by mass of calcium carbonate (CaCO$_3$)
  Resin C: Epoxy resin ("2272H" produced by ThreeBond Holding Co., Ltd.)
  Resin D: EVA resin ("LOCTITE hotmelt adhesive" produced by Henkel)
  Tape A: PVC tape ("vinyl tape for wiring harness No. 2117TVH" produced by Nitto Denko Corporation), thickness of 0.07 mm
  Tape B: Fluororesin tape ("AGF-100A" produced by Chukoh Chemical Industries Ltd.), thickness of 0.13 mm.

<Test Method>

The fabricated FPC fuse was connected to a direct-current power supply, and a current of 2.5 A was caused to flow for 60 sec to fuse and cut the copper foil. Thereafter, the external appearance of the protection layer was visually observed and whether or not carbide had been formed was evaluated. Further, for the FPC fuse using the resin A, an energy dispersive X-ray analysis (SEM-EDX) using a scanning electron microscope was conducted for a cross-section in a state after the copper foil was fused and cut by energization, and a spatial distribution of constituent elements was observed.

<Results>

The constituent materials of the protection layers and the presence or absence of carbide formation are compiled in Table 1 below.

TABLE 1

| Material of Protection Layer | Specific Heat (J · g$^{-1}$ · $^{-1}$) | Specific Gravity (g · cm$^{-3}$) | Carbide Formation |
|---|---|---|---|
| Resin A | 1.13 | 1.15 | No |
| Resin B | 1.65 | 1.23 | No |
| Resin C | 1.04 | 1.10 | Yes |
| Resin D | 2.57 | 0.92 | Yes |
| Tape A | 1.05 | 1.16 | Yes |
| Tape B | 1.32 | 1.77 | No |

According to Table 1, no carbide was formed in the protection layer when the copper foil was fused and cut in the FPC fuses having the protection layers constituted by the resins A, B and the tape B. Those materials constituting the protection layers have both a specific heat of 1.1 J·g$^{-1}$·K$^{-1}$ or more and a specific gravity of 1.0 g·cm$^{-3}$ or more. From this, it can be understood that the circuit can be interrupted by the fused and cut conductor layer while the carbonization of the protection layer is avoided when an abnormal current is generated by using the material having a specific heat of 1.1 J·g$^{-1}$·K$^{-1}$ or more and a specific gravity of 1.0 g·cm$^{-3}$ or more as the protection layer provided in the fuse element.

Figure 2:
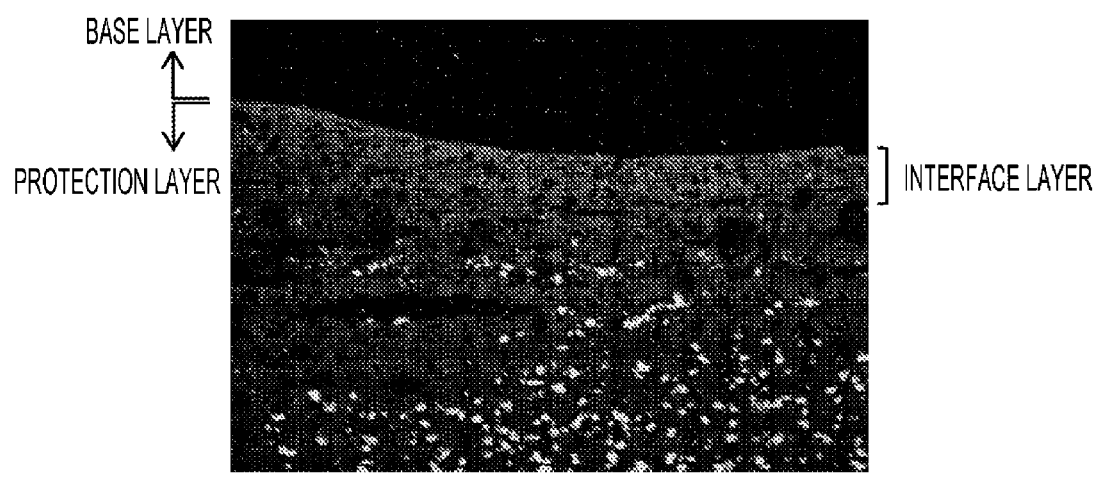
FIG. 2 is an element distribution image showing a distribution of Si in an interface between a protection layer and a base layer in a cross-section of the fuse element.

FIG. 2 shows a spatial distribution of Si in an interface between the protection layer and the base layer obtained by a SEM-EDX measurement for the FPC fuses having the protection layers constituted by the silicone resins. A density of Si is high at positions displayed in light color. In an image, an upper layer observed to be dark corresponds to the base layer and a lower layer, in which regions having a high density of Si are unevenly scattered, is the protection layer. In the interface between those base layer and protection layer, there is a region where Si is distributed with high uniformity and high density as shown as an "interface layer" in the image in a region on the side of the protection layer. Although not shown in the image, it was confirmed that O was also distributed with high uniformity and high density in this region of the interface layer. That is, it is indicated that silicone oxides (SiO$_x$) were produced after heating when the conductor layer was fused and cut in the interface of the protection layer facing the conductor layer via the base layer.

Although the embodiment of the present disclosure has been described in detail above, the present invention is not limited to the above embodiment at all and various changes can be made without departing from the gist of the present invention.

LIST OF REFERENCE NUMERALS

10 FPC fuse (fuse element)
1 metal foil (conductor layer)
2 adhesive layer
3 base layer (base material)
4 protection layer

What is claimed is:

1. A fuse element, comprising:
   a base layer comprising an insulating base material;
   a conductor layer provided on a surface of the insulating base material; and
   a protection layer formed of an insulating material and provided on a surface of the conductor layer via at least one of the base layer and an adhesive layer, the protection layer having a specific heat of 1.1 $J \cdot g^{-1} \cdot K^{-1}$ or more and a specific gravity of 1.0 $g \cdot cm^{-3}$ or more, wherein
   the insulating base material of the base layer is provided on both surfaces of the conductor layer,
   the protection layer is provided on a surface of the insulating base material provided on one of the surfaces of the conductor layer,
   the fuse element is configured using a flexible printed circuit board,
   the insulating base material and the conductor layer of the fuse element are respectively constituted by a base layer of the flexible printed circuit board and a metal foil of the flexible printed circuit board, and
   the protection layer covers the conductor layer via the base layer of the flexible printed circuit board and a layer of an adhesive of the flexible printed circuit board.

2. The fuse element of claim 1, wherein:
   the protection layer contains at least one, two or more of a silicone resin, a modified silicone resin, a urethane resin, and a fluororesin, and
   the base layer contains at least one of polyethylene terephthalate and polyimide.

3. The fuse element of claim 2, wherein the protection layer contains an insulating filler.

4. The fuse element of claim 3, wherein a content of the insulating filler in the protection layer is 5% by mass or more and 30% by mass or less in ratio to the entire protection layer.

5. The fuse element of claim 2, wherein the protection layer contains foam cells.

6. The fuse element of claim 5, wherein the protection layer contains the foam cells and an insulating filler.

7. The fuse element of claim 2, wherein the protection layer contains two or more of the silicone resin, the modified silicone resin, the urethane resin, and the fluororesin.

8. The fuse element of claim 1, wherein the protection layer contains at least one of a silicone resin and a modified silicone resin.

9. The fuse element of claim 1, wherein the protection layer contains a fluororesin.

* * * * *